US008796589B2

(12) United States Patent
Quiles et al.

(10) Patent No.: US 8,796,589 B2
(45) Date of Patent: Aug. 5, 2014

(54) PROCESSING SYSTEM WITH THE DUAL END-EFFECTOR HANDLING

(75) Inventors: Efrain Quiles, San Jose, CA (US);
Mehran Behdjat, San Jose, CA (US);
Robert B. Lowrance, Los Gatos, CA (US); Michael Robert Rice, Pleasanton, CA (US); Brent Vopat, Topeka, KS (US)

(73) Assignee: Applied Materials, Inc., Santa Clara, CA (US)

( * ) Notice: Subject to any disclaimer, the term of this patent is extended or adjusted under 35 U.S.C. 154(b) by 1585 days.

(21) Appl. No.: 10/483,793

(22) PCT Filed: Jul. 13, 2002

(86) PCT No.: PCT/US02/22006
§ 371 (c)(1),
(2), (4) Date: Jan. 14, 2004

(87) PCT Pub. No.: WO03/009346
PCT Pub. Date: Jan. 30, 2003

(65) Prior Publication Data
US 2005/0072716 A1    Apr. 7, 2005

Related U.S. Application Data

(60) Provisional application No. 60/305,679, filed on Jul. 15, 2001.

(51) Int. Cl.
*B65H 1/00* (2006.01)
*F27B 5/14* (2006.01)
(52) U.S. Cl.
USPC ............................ 219/390; 414/941; 414/805

(58) Field of Classification Search
USPC ................... 219/390, 402–406; 118/724, 725; 414/941, 217, 805; 29/390, 402–406
See application file for complete search history.

(56) References Cited

U.S. PATENT DOCUMENTS

| 4,493,606 A | 1/1985 | Foulke et al. |
| 5,044,752 A | 9/1991 | Thurfjell et al. |
| 5,564,889 A | 10/1996 | Araki |
| 5,565,034 A | 10/1996 | Nanbu et al. |

(Continued)

FOREIGN PATENT DOCUMENTS

| EP | 1 152 456 A2 | 11/2001 |
| JP | 62-140735 | 9/1987 |

(Continued)

OTHER PUBLICATIONS

SUNX, Information on Discontinued Models, Nov. 2004, SUNX, p. 1-3.*

(Continued)

*Primary Examiner* — Brian Jennison
(74) *Attorney, Agent, or Firm* — Dugan & Dugan, PC

(57) ABSTRACT

In a first aspect, a first substrate processing system is provided that includes (1) a chamber having a plurality of opening through which a substrate may be transported; (2) a substrate carrier opener coupled to a first one of the plurality of openings; (3) a thermal processing chamber coupled to a second one of the plurality of openings; and (4) a wafer handler contained within the chamber, having a substrate clamping blade and a blade adapted to transport high temperature substrates.

28 Claims, 10 Drawing Sheets

(56) References Cited

U.S. PATENT DOCUMENTS

| | | | |
|---|---|---|---|
| 5,697,748 A * | 12/1997 | Somekh et al. | 414/217 |
| 5,711,647 A * | 1/1998 | Slocum | 414/751.1 |
| 5,951,770 A | 9/1999 | Perlov et al. | |
| 5,974,682 A | 11/1999 | Akimoto | |
| 5,980,194 A | 11/1999 | Freerks et al. | |
| 6,053,983 A | 4/2000 | Saeki et al. | |
| 6,113,165 A | 9/2000 | Wen et al. | |
| 6,167,322 A * | 12/2000 | Holbrooks | 700/112 |
| 6,199,927 B1 | 3/2001 | Shamlou et al. | |
| 6,206,441 B1 | 3/2001 | Wen et al. | |
| 6,222,337 B1 | 4/2001 | Kroeker et al. | |
| 6,275,748 B1 * | 8/2001 | Bacchi et al. | 700/275 |
| 6,287,386 B1 | 9/2001 | Perlov et al. | |
| 6,298,280 B1 | 10/2001 | Bonora et al. | |
| 6,313,596 B1 | 11/2001 | Wyka et al. | |
| 6,322,312 B1 * | 11/2001 | Sundar | 414/744.5 |
| 6,355,909 B1 * | 3/2002 | Griffiths et al. | 219/403 |
| 6,405,101 B1 | 6/2002 | Johanson et al. | |
| 6,409,453 B1 | 6/2002 | Brodine et al. | |
| 6,435,809 B2 * | 8/2002 | Goodwin et al. | 414/805 |
| 6,438,449 B2 | 8/2002 | Kawamatsu et al. | |
| 6,453,214 B1 | 9/2002 | Bacchi et al. | |
| 6,468,353 B1 | 10/2002 | Perlov et al. | |
| 6,500,261 B1 | 12/2002 | Chen et al. | |
| 6,502,054 B1 | 12/2002 | Mooring et al. | |
| 6,520,727 B1 | 2/2003 | Babbs et al. | |
| 6,575,737 B1 | 6/2003 | Perlov et al. | |
| 6,631,935 B1 * | 10/2003 | Casarotti et al. | 294/64.1 |
| 6,742,977 B1 * | 6/2004 | Okayama et al. | 414/217 |
| 6,916,397 B2 | 7/2005 | Pfeiffer et al. | |
| 7,039,498 B2 | 5/2006 | Bacchi et al. | |
| 2002/0170672 A1 | 11/2002 | Perlov et al. | |
| 2007/0141748 A1 | 6/2007 | Rice | |
| 2009/0108544 A1 | 4/2009 | Sico et al. | |

FOREIGN PATENT DOCUMENTS

| | | |
|---|---|---|
| JP | 02-148752 | 6/1990 |
| JP | 03-160744 | 7/1991 |
| JP | 04-239743 | 8/1992 |
| JP | 04-278561 | 10/1992 |
| JP | 04-345050 | 12/1992 |
| JP | 07-19149 | 5/1995 |
| JP | 07-40080 | 7/1995 |
| JP | 09-283603 | 10/1997 |
| JP | 11-176910 | 7/1999 |
| JP | 11-308679 | 11/1999 |
| KR | 100272188 | 12/2000 |
| WO | WO 00/68625 | 11/2000 |
| WO | WO 03/009346 | 1/2003 |

OTHER PUBLICATIONS

Office Action of Japanese Application No. P2003-514593 mailed Mar. 18, 2008.

Final Office Action of Japanese Application No. 2003-514593 mailed Dec. 9, 2008.

Office Action of Chinese Patent Application No. 02814161.X mailed on Aug. 16, 2006.

Office Action of Chinese Patent Application No. 02814161.X mailed on May 31, 2007.

Office Action of Chinese Patent Application No. 02814161.X mailed on Nov. 29, 2007.

International Search Report of PCT International Application No. PCT/US02/22006 mailed on Jan. 26, 2004.

International Preliminary Examination Report of PCT International Application No. PCT/US02/22006 mailed on Apr. 14, 2008.

(Korean App. No. 10-2004-7000587) Office Action dated Dec. 15, 2008.

Office Action of Taiwanese Patent Application No. 91115744 dated May 6, 2004.

Office Action of Taiwanese Patent Application No. 91115744 dated Oct. 16, 2003.

* cited by examiner

US 8,796,589 B2

PROCESSING SYSTEM WITH THE DUAL END-EFFECTOR HANDLING

This application claims priority from U.S. Provisional Patent Application Ser. No. 60/305,679, filed Jul. 15, 2001, titled "Processing System", which is hereby incorporated by reference herein in its entirety.

BACKGROUND

In the field of substrate processing, improvements in substrate handling speed and reliability can translate into significant cost savings, and improved substrate quality. Likewise, a reduction in footprint (i.e., the projected floor space occupied by a processing system), and/or a reduction in equipment cost and complexity may result in reduced cost per substrate processed. Accordingly, substrate processing systems that improve throughput speed, reduce equipment cost and complexity and/or reduce the potential for substrates to be exposed to particles are desired.

SUMMARY

An inventive substrate processing system that transfers both hot and cold substrates is provided, as is an inventive method of transferring and processing substrates within the system. Also employed are inventive apparatuses and methods for sensing substrates on a substrate handler blade, for employing a ventilated valve assembly to deter toxic processing gases from entering an ambient environment, and/or for cooling substrates within a transfer chamber. Each such apparatus and method may be employed with the inventive system or with other processing systems and methods, as will be apparent from the figures and description provided below.

More specifically, in a first aspect of the invention, a first substrate processing system is provided that includes (1) a chamber having a plurality of openings through which a substrate may be transported; (2) a substrate carrier opener coupled to a first one of the plurality of openings; (3) a thermal processing chamber coupled to a second one of the plurality of openings; and (4) a wafer handler contained within the chamber, having a substrate clamping blade and a blade adapted to transport high temperature substrates.

In a second aspect of the invention, a second substrate processing system is provided that includes (1) a chamber having a plurality of openings through which a substrate may be transported; and (2) a wafer handler contained within the chamber having a substrate clamping blade and a blade adapted to transport high temperature substrates.

In a third aspect of the invention, a substrate handler is provided that includes (1) a substrate clamping blade; and (2) a blade adapted to transport high temperature substrates.

In a fourth aspect of the invention, a valve assembly is provided that is adapted to seal an opening in a chamber. The valve assembly includes a housing having a first opening on a first side and a threshold portion. The housing is adapted for coupling to a chamber surface having an opening therein, such that a substrate may be transferred through the first opening and the chamber opening and such that the threshold portion is positioned between the first opening and the chamber opening. The threshold portion has one or more inlets adapted to supply a curtain of gas across the chamber opening. The valve assembly further includes a sealing surface positioned within the housing to selectively (1) seal the chamber opening, and (2) retract from the chamber opening so as not to obstruct substrate passage therethrough. Numerous other aspects are provided, as are methods and computer program products in accordance with these and other aspects of the invention.

Other features and aspects of the present invention will become more fully apparent from the following detailed description, the appended claims and the accompanying drawings.

DETAILED DESCRIPTION

Figure 1:
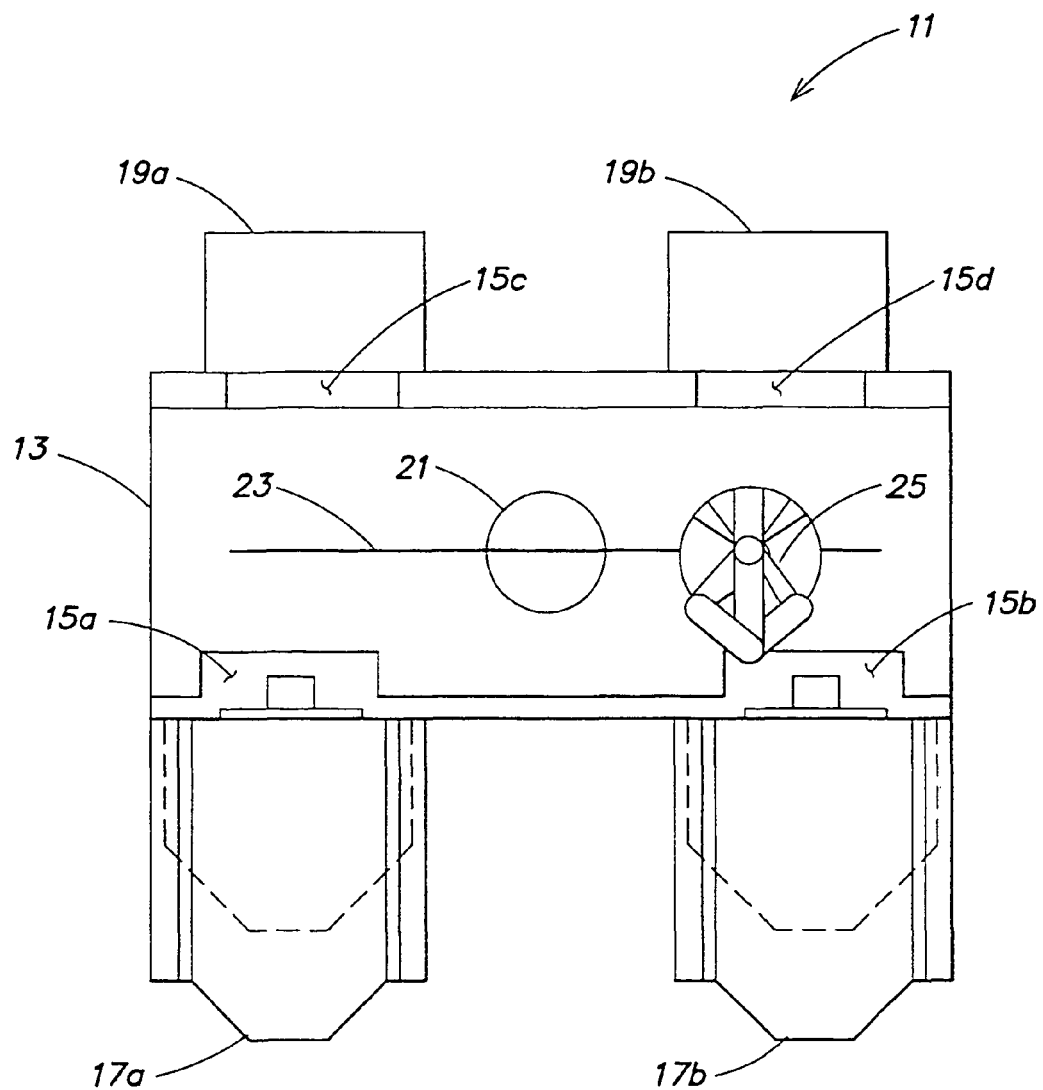
FIG. 1 is a top plan view of an exemplary aspect of the inventive system.

FIG. 1 is a top plan view of an inventive processing system 11. The processing system 11 comprises a chamber 13 having a plurality of openings 15*a-d* through which a substrate may be transferred. Each opening 15*a-d* preferably is positioned at a similar elevation (referred to herein as the wafer exchange elevation). In the embodiment shown, openings 15*a-b* are located on a first side of the chamber 13 and openings 15*c-d* are located on a second side of the chamber 13, opposite the first side of the chamber 13. A station 17*a* adapted to open a sealed wafer carrier (i.e., a pod opening station 17*a*) is coupled to the opening 15*a* and a pod opening station 17*b* is coupled to the opening 15*b*. Pod opening stations are well known in the art, and an exemplary pod opening station is described in detail in U.S. Pat. No. 6,082,951 issued Jul. 4, 2000, the entire disclosure of which is incorporated herein by this reference.

Coupled to the openings 15*c-d* are thermal processing chambers 19*a-b* such as the commercially available RADIANCE™ Chamber manufactured by Applied Materials of Santa Clara Calif., or any other chamber that elevates substrates to temperatures above 70° C. for example and preferably to approximately 600° C.

A cooling station 21 may be contained within the chamber 13 (e.g., coupled to the same datum plate as the substrate handler, and at a higher elevation than the chamber openings) and may comprise one or more platforms designed to support and cool a substrate as is known in the art. An inventive cooling station is shown in FIGS. 4A-E and described below with reference thereto.

Figure 2:
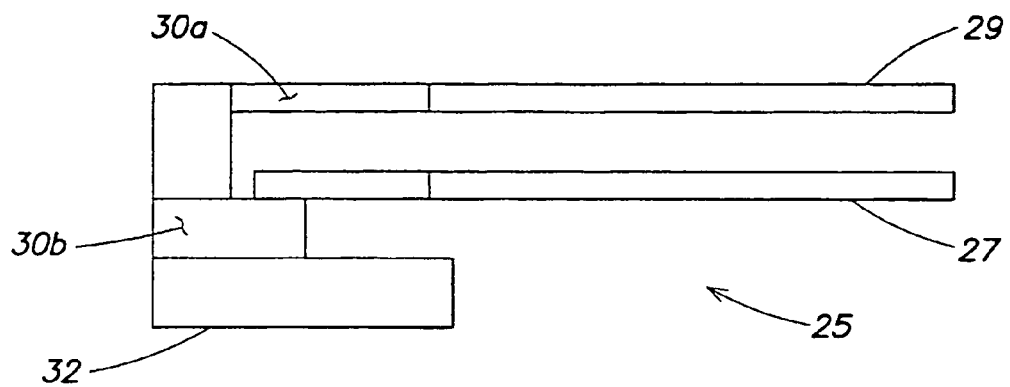
FIG. 2 is a schematic side elevational view of an exemplary aspect of an inventive substrate handler.
Figure 3A:
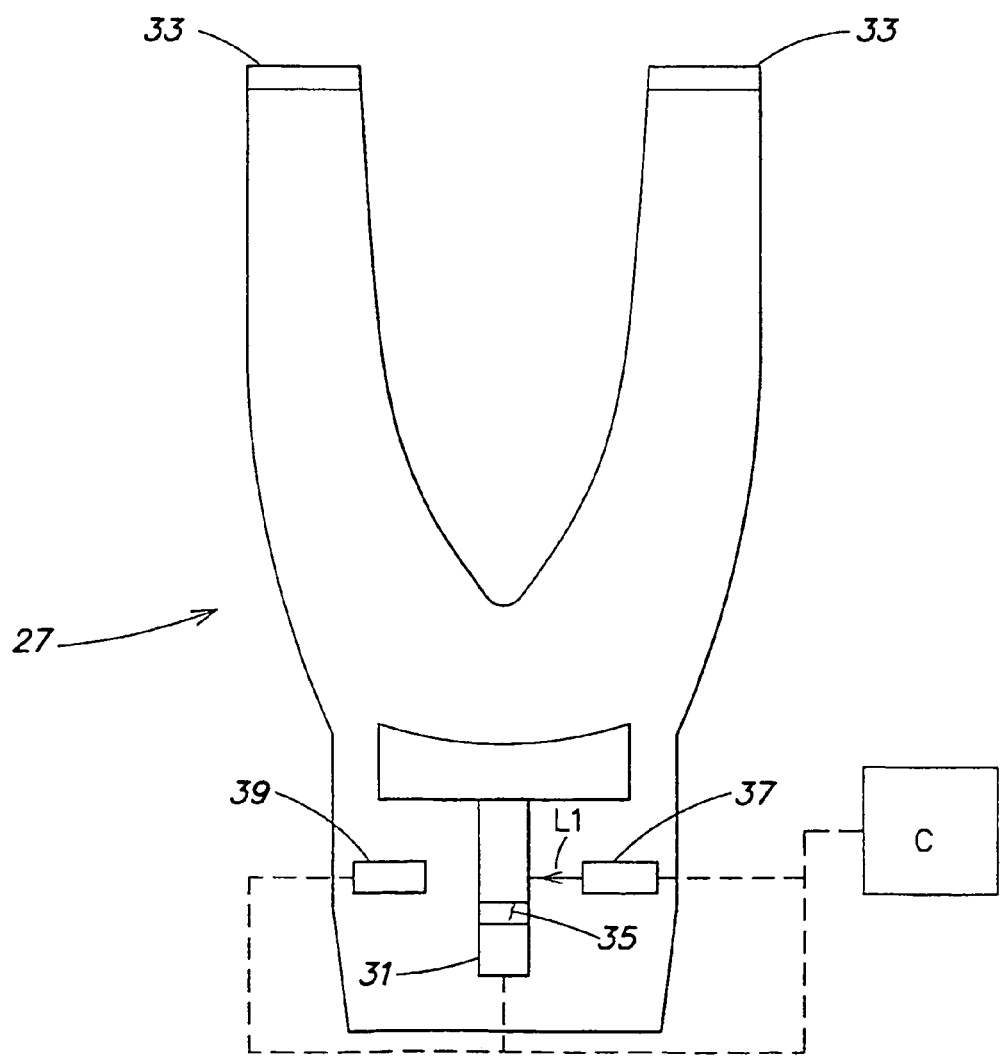
FIG. 3A is a top plan view of a clamping substrate handler blade having a substrate sensor coupled thereto.
Figure 3B:
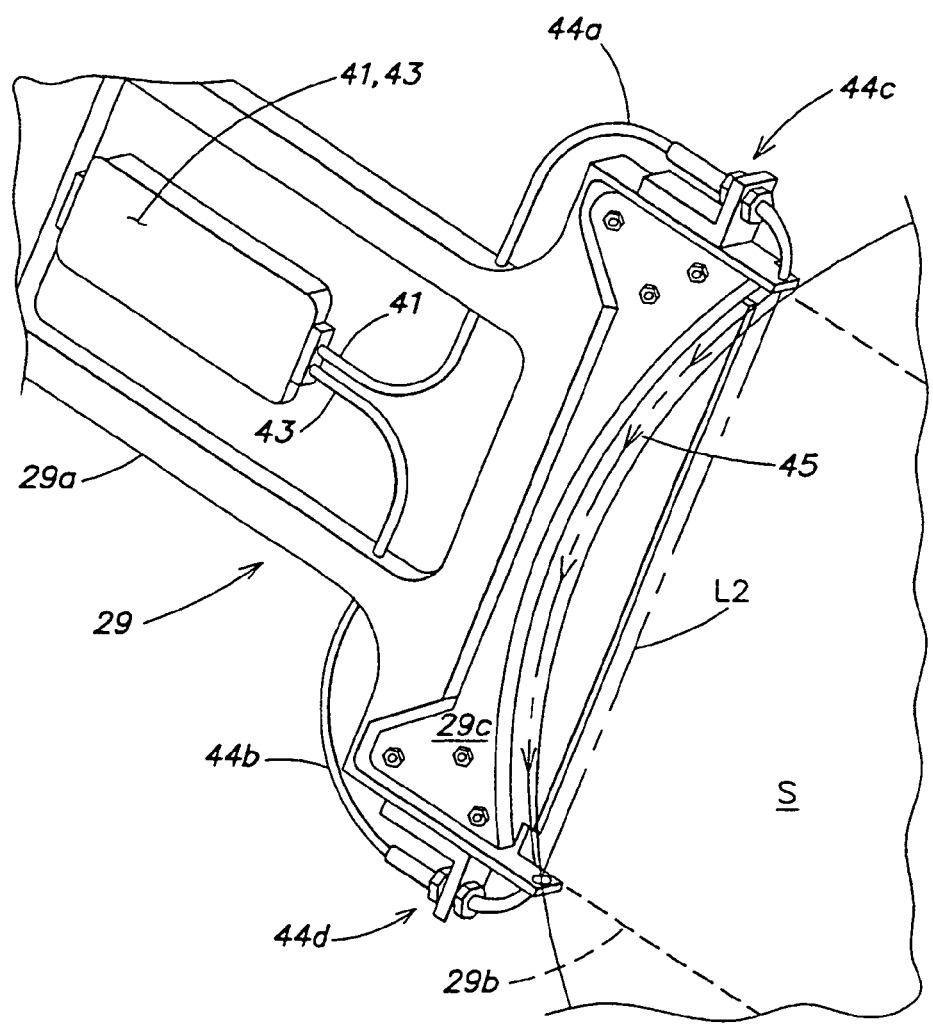
FIG. 3B is a top perspective view of hot substrate handler blade having a substrate sensor coupled thereto.

Also contained within the chamber 13 may be a track 23 that extends a sufficient distance so that a substrate handler coupled to travel therealong may pick up or place substrates to or from any of the pod opening stations 17*a-b*, processing chambers 19*a-b*, or cooling station 21. Mounted so as to travel along the track 23 is a substrate handler 25 (FIG. 2) having both a blade adapted to clamp a substrate in place thereon (i.e., a clamping blade 27), as shown in FIG. 3A, and a blade adapted to transport a hot substrate, for example, a substrate having a temperature of above 70° C., and in one embodiment a temperature of approximately 600° C. or higher (i.e., a hot blade 29), as shown in FIG. 3B. As illustrated in FIG. 3B, the hot blade 29 may not include a clamping mechanism. The substrate handler 25 may also comprise a pair of vertically stacked independently extendable arms 30*a-b* each having one of the clamping blade 27 and the hot blade 29 coupled thereto, as shown in the side elevational view of FIG. 2.

Figure 3C:
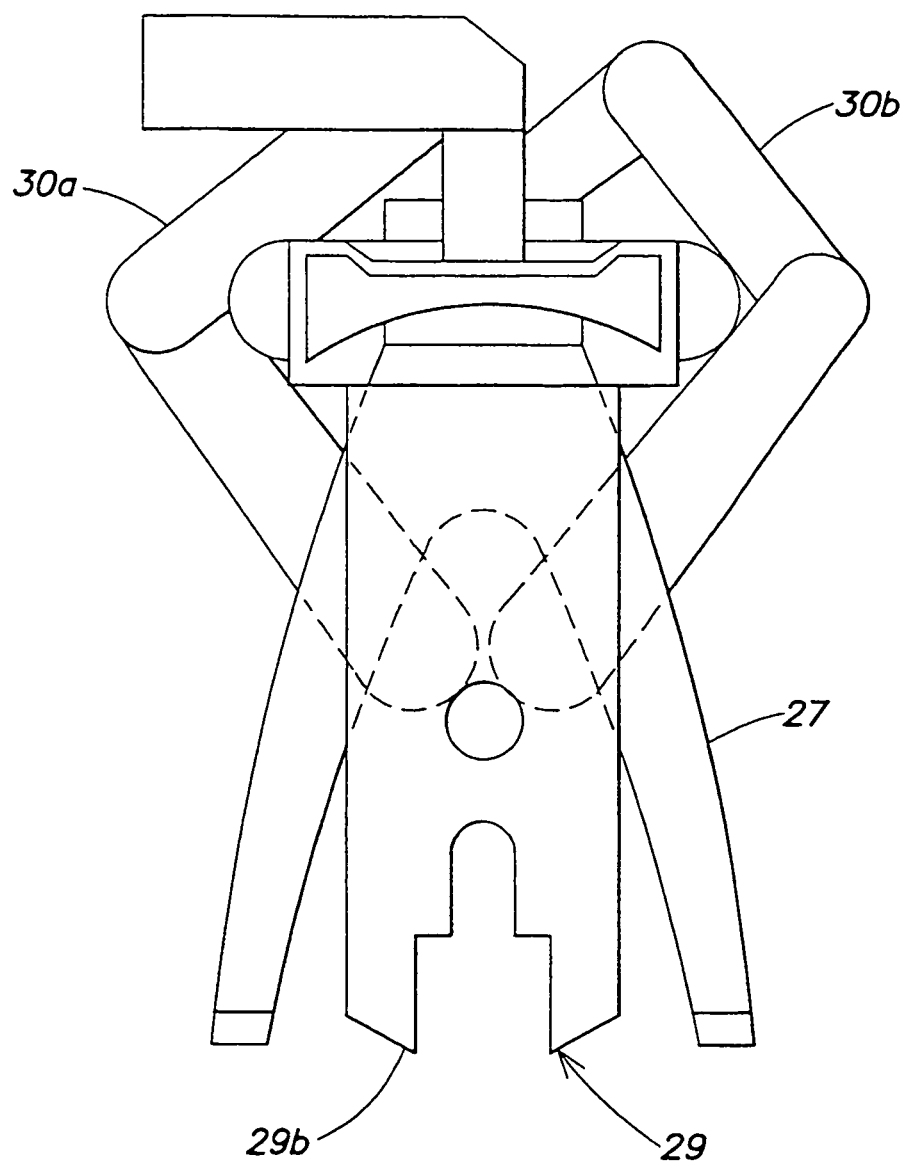
FIG. 3C is a top plan view of the substrate handler of FIG. 2.

Except for the inventive hot blade 29, the substrate handler 25 may be a commercially available robot manufactured by Yaskawa Japan. For example, the substrate handler 25 may employ a central canister 32 (FIG. 2) that rotates at least 180 degrees, and has two independently extendable robot arms (e.g., arms 30*a-b* in FIG. 3C) coupled thereto. Thus when the canister 32 lifts, lowers or rotates, the two arms lift, lower and rotate together therewith. The two arms are vertically offset (FIG. 2) such that the blade coupled to one arm (e.g., hot blade 29) is above (and in approximately the same footprint) as the blade coupled to the other arm (e.g., clamping blade 27). In order to insert and extract a substrate from an opening, the central canister 32 elevates to position the correct blade in the plane of the opening. Other robot configurations having acceptable reach may be employed, without the track. Also two robots may be contained within the chamber 13 and thus the track 23 may be omitted.

The two independently extendable and retractable arms 30*a-b*, and the clamping blade 27 and hot blade 29 coupled thereto allow the processing system 11 to transfer substrates much more efficiently than is possible with conventional thermal processing systems. Because the clamping blade 27 includes a mechanism for clamping substrates, the clamping blade 27 may transport substrates more quickly than can a blade that does not include a clamping mechanism. Although other clamping mechanisms may be employed, an exemplary clamping mechanism is shown in the top plan view of FIG. 3A. The clamping mechanism comprises a plunger 31 and a pair of edge stops 33 (e.g., formed from a high temperature material such as VESPEL or PEEK in at least one embodiment). In operation, after the clamping blade 27 has completed a programmed sequence of movements that causes the clamping blade 27 to lift a substrate (not shown) from a pod (e.g., positioned at one of the pod opening stations 17*a-b*), the processing chambers 19*a-b*, or the cooling station 21, a controller C causes the plunger 31 to gradually move forward to a position wherein the substrate is firmly held between the edge stops 33 and the plunger 31. The plunger 31 may be designed so as to interact with a light detector (described below) to thereby detect whether or not a substrate has been properly clamped.

In the example of FIG. 3A, the plunger 31 has an opening 35 located such that a light beam L1 emitted by an emitter 37 passes through the opening 35 (and strikes a light sensor 39) only when the plunger 31 is in the position where it contacts the edge of a properly positioned substrate. In all other positions solid portions of the plunger 31 block the light beam L1. In this manner no light beam is detected both when the plunger 31 is in its retracted position (prior to substrate placement on the clamping blade 27) and when the plunger 31 has extended beyond the position where it should contact the edge of a properly positioned substrate.

A controller (e.g., controller C in FIG. 3A) coupled to the light sensor 39 may signal a miss-clamp and prevent the clamping blade 27 from moving when the plunger 31 extends beyond the proper substrate clamping position. Thus the clamping blade 27 may allow both faster substrate transfer, and may allow the processing system 11 to be less expensive, as fewer sensors need to be stationarily mounted therein. The emitter 37 and light sensor 39 may comprise any conventional light source and detector.

The expense of the processing system 11 may be further reduced as compared to conventional systems by coupling a sensor to the hot blade 29, as shown in the top perspective view of FIG. 3B. The hot blade 29 has a support bracket portion 29*a* and a blade portion 29*b* as shown. The hot blade 29 has a light emitter 41 and a light detector 43 positioned (through use of high temperature fiber optic cables 44*a*, 44*b* and fiber optic support brackets 44*c*, 44*d*) such that a properly positioned substrate S blocks a light beam L2 from traveling therebetween. In order to endure contact with hot substrates, the hot blade 29 may be comprised of quartz or a similar high temperature material. In order to prevent light from the emitter 41 from coupling to the quartz blade 29 and traveling though the quartz to the light detector 43 (as shown by arrow 45) the portion of the hot blade 29 adjacent the emitter 41 and adjacent the detector 43 may be coated with a non-refractive coating such as silicon carbide. For example, the emitter and/or detector may be surrounded by metal to deter erroneous detection of reflections, and the beam gain threshold may be adjusted to compensate for reflection and refraction (e.g., via a suitable amplifier). Accordingly, when the detector 43 does not receive the light beam L2 emitted by the emitter 41, the hot blade 29 detects that a substrate is properly positioned on the hot blade 29; when the light signal from light beam L2 is detected, a substrate is either absent or is improperly positioned. The controller C (FIG. 3A) may prevent movement of the hot blade 29 when a substrate is expected to be properly positioned on the hot blade 29 and the light beam is not broken.

In at least one embodiment, the support bracket portion 29*a* of the hot blade 29 may comprise a stainless steel quartz/metal support bracket, and the blade portion 29*b* may comprise quartz (coupled via a quartz/metal plate 29*c*). Other materials may be employed.

Because both the clamping blade 27 and the hot blade 29 have sensors adapted to sense when a substrate is properly positioned on the clamping blade 27 or on the hot blade 29 (e.g., both blades employ integrated wafer on blade sensors), there is no need for stationary "substrate on blade" sensors. Because the substrate handler 25 comprises both a clamping blade and a hot blade, considerable throughput advantages can be achieved as will be understood from the operational description provided below.

In operation a substrate carrying pod is placed on the pod opening station 17*a* and the pod door of the pod is opened. The substrate handler 25 travels along the track 23 to a position in front of the opening 15*a* associated with the pod opening station 17*a*. Assuming the clamping blade 27 is at the wafer exchange elevation, the substrate handler's extendable arm 30*b* extends carrying the clamping blade 27 through the opening 15*a* into the pod opening station 17*a* such that the clamping blade 27 is positioned below a first substrate. The substrate handler 25 then elevates slightly such that the clamping blade 27 lifts the first substrate from the pod's internal supports. The controller C recognizes that a substrate should be in position on the clamping blade 27, and the plunger 31 (FIG. 3A) is actuated so as to slowly move toward the edge stops 33, gently pushing the substrate forward such that the substrate is held in place between the plunger 31 and the edge stops 33.

As previously described, the clamping blade sensor (e.g., light emitter 37 and light sensor 39) may sense that the substrate is properly clamped. If the substrate is determined to be properly clamped, the extendable arm 30*b* retracts, the substrate handler 25 rotates the clamping blade 27 to face the opening 15c (FIG. 1) and travels along the track 23 to position the clamping blade 27 in front of the opening 15a (if necessary). The opening 15c opens and the extendable arm 30b extends carrying the first substrate into position above a wafer support (not shown) contained within the processing chamber 19a. All of the above described substrate transport steps may occur at higher speeds because the substrate is clamped on the clamping blade 27.

Once within the processing chamber 19a, the plunger 31 (FIG. 3A) retracts and the first substrate is lifted from the clamping blade 27 by a lift mechanism (not shown) contained within the processing chamber 19a, and/or by lowering the clamping blade 27 so as to transfer the first substrate onto a plurality of support pins or other supporting structure (not shown). Thereafter the above sequence repeats with the clamping blade 27 placing a second substrate within the processing chamber 19b. As soon as thermal processing of the first substrate is complete, the hot blade 29 is positioned at the wafer exchange elevation, the opening 15c opens, the extendable arm 30a extends and the hot blade 29 retrieves the hot first substrate (e.g., lifts the hot first substrate from the support pins). Thereafter, the hot blade 29 retracts, and the substrate handler 25 elevates to position the clamping blade 27 at the wafer exchange elevation. The clamping blade 27 then extends carrying a third substrate into the processing chamber 19a. In this manner, not only is a hot (processed)/cold (unprocessed) substrate exchange able to be performed via a single substrate handler, the exchange is also able to take place without intermission (i.e., without requiring the substrate handler 25 to travel to other locations for placement of the processed substrate and pickup of the unprocessed substrate). Thereafter, the hot first substrate may be carried to a support shelf (not shown) of the cooling station 21, and transferred to the support shelf (e.g., via the support shelf's lifting mechanism and/or via lowering of the hot blade 29). Once placed on the support shelf, the first substrate cools (e.g., air cools or cools via a cooled plate such as that of FIGS. 4A-E).

Thereafter the substrate handler 25 may employ the hot blade 29 to extract the processed hot second substrate from the processing chamber 19b, and transport the second substrate to the cooling station 21 for cooling. If the first substrate has been cooling for a sufficient time, the clamping blade 27 may extract the cooled first substrate from the cooling station 21 and quickly return the first substrate to the pod opening station 17a.

As is apparent from the above description, the inventive processing system 11 is able to increase throughput by using a clamping blade to transfer substrates whenever they are not hot. Also, because both the clamping blade 27 and the hot blade 29 may have substrate sensors that verify proper substrate clamping or positioning, the processing system 11 may avoid the additional expense of stationary substrate on blade sensors (e.g., sensors that are not located on a blade) that would otherwise be located at various positions within the processing system 11 (e.g., in front of each location where substrate exchange occurs).

The inventive processing system 11 may also employ other features to further enhance operation. For example, the clamping blade 27 and/or the hot blade 29 may have one or more sensors mounted on the leading end of each blade and directed forward (toward the direction the blade travels). The sensor(s) may detect that a substrate is present in a given slot or location, before the blade travels into position therebelow. Such sensors are provided for example on substrate handler's such as those manufactured by Yaskawa Japan.

Figure 4A:
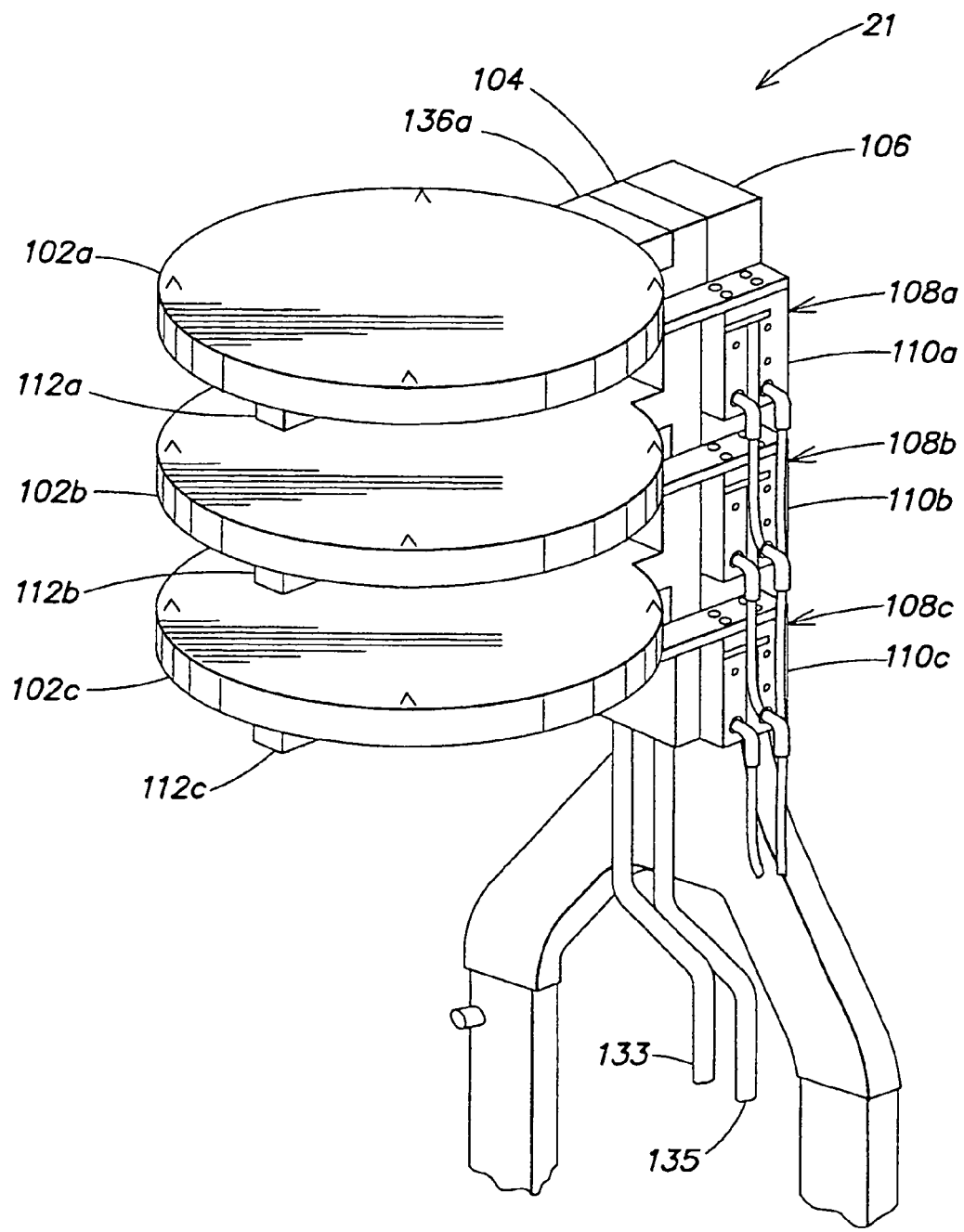
FIGS. 4A-E are views of a cooling platform that may be employed within the system of FIG. 1.
Figure 4B:
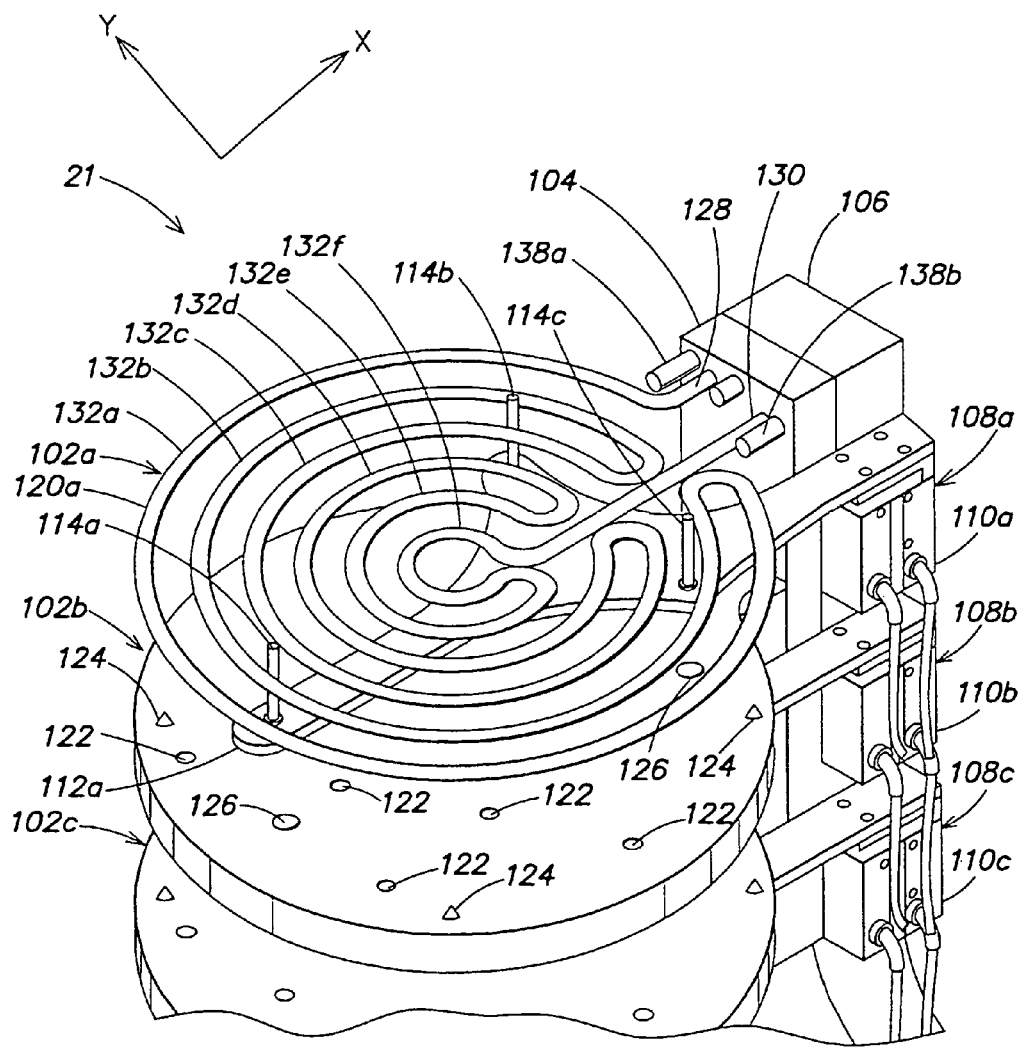

FIG. 4A is a perspective view of a first exemplary embodiment of the cooling station 21 of FIG. 1. The cooling station 21 includes a plurality of cooling platforms 102a-c each configured to cool a semiconductor wafer as described below. While three cooling platforms 102a-c are shown in FIG. 4A, it will be understood that the cooling station 21 may comprise fewer or more cooling platforms. FIG. 4B is a perspective view of the cooling station 21 of FIG. 4A that shows an internal cooling structure of the top cooling platform 102a (described below).

Figure 4C:
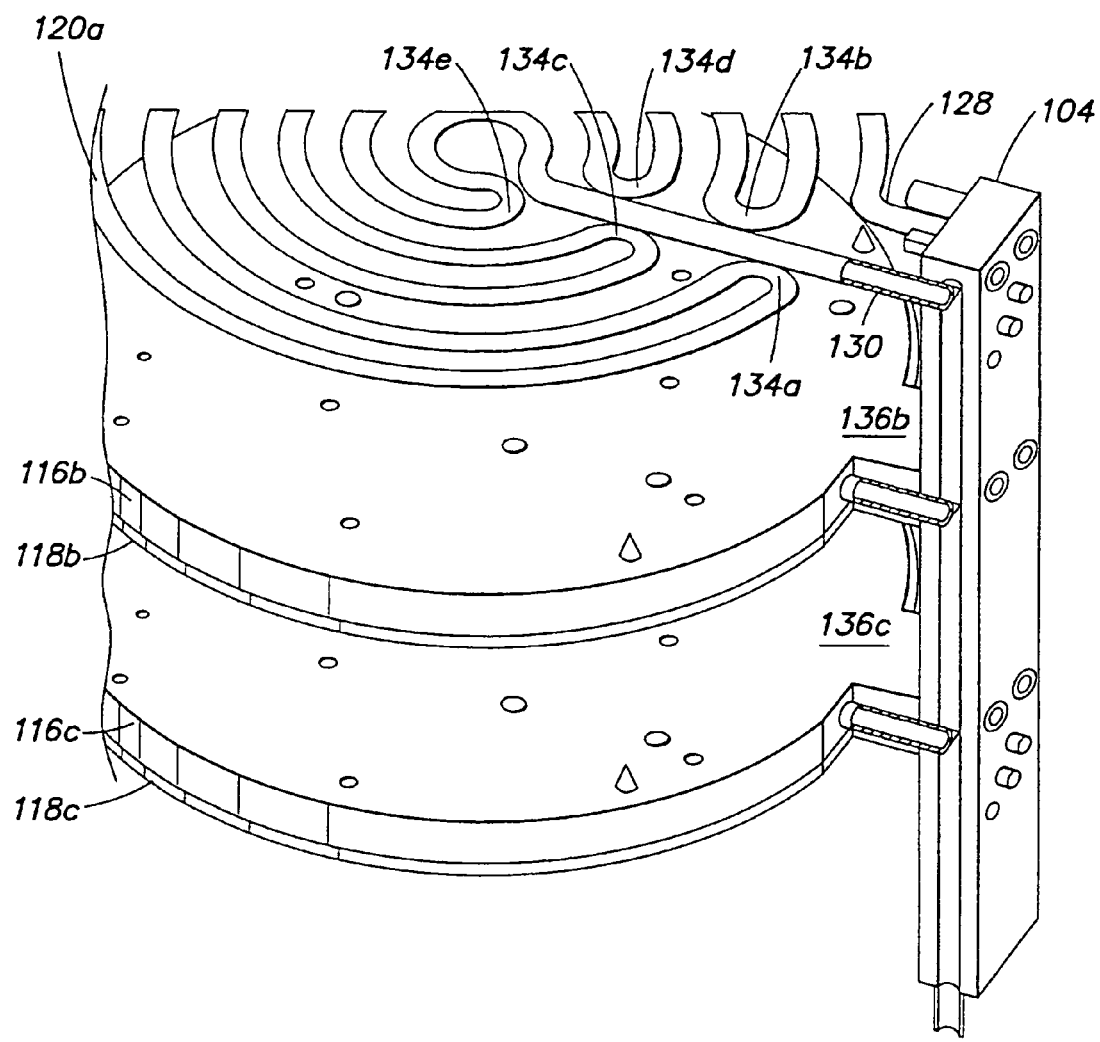
Figure 4D:
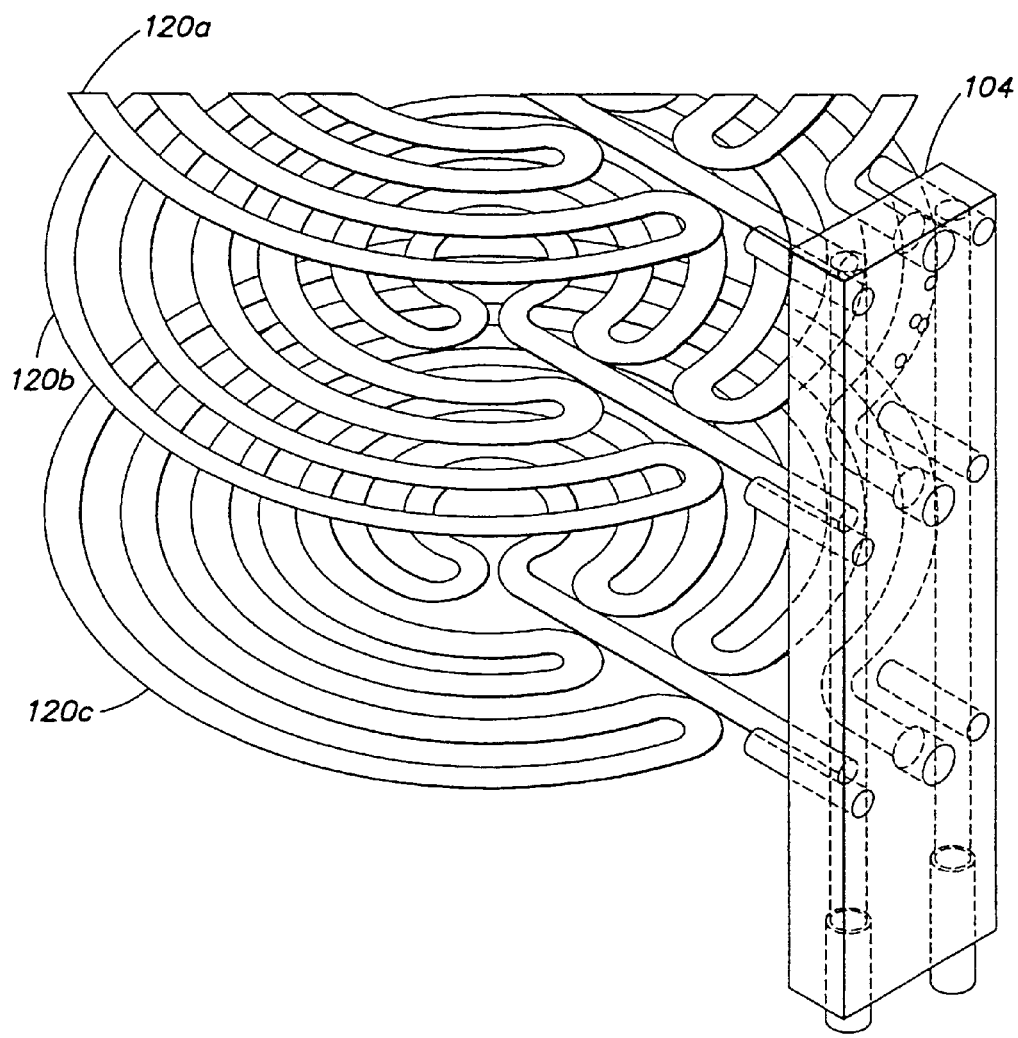

Each cooling platform 102a-c is coupled to a manifold 104 (e.g., via brazing, bolts, screws and/or some other fastening technique), which is in turn coupled to a support bracket 106 (e.g., aluminum or any other suitable material). FIG. 4C is a perspective view of the cooling station 21 of FIG. 4A that shows one method of coupling an internal cooling structure of each cooling platform 102a-c to the manifold 104 (e.g., brazing). FIG. 4D is a perspective view of an internal cooling structure of each cooling platform 102a-c.

With reference to FIGS. 4A and 4B, a plurality of lift mechanisms 108a-c are coupled to the support bracket 106 that allow semiconductor wafers (or other substrates) to be lowered onto or lifted from the cooling platforms 102a-c (as described below). Each lift mechanism 108a-c includes a lift portion 110a-c and a lift pin support arm 112a-c coupled to the lift portion 110a-c. Each lift pin support arm 112a-c includes a plurality of lift pins 114a-c that may lift and lower through holes (described below) in a respective cooling platform 102a-c as the lift support arm 112a-c is lifted and lowered via the lift portion 110a-c. Semiconductor wafers thereby may be raised from and lowered onto each cooling platform 102a-c (e.g., for removal from and placement onto each cooling platform 102a-c). The lift mechanisms 108a-c may comprise, for example, 1.6 mm bore pneumatic cylinders, although any conventional lift mechanisms may be similarly employed. One exemplary lift mechanism is a Device Net EV pneumatic block. Each lift mechanism 108a-c may include sensors for detecting lift cylinder position (e.g., two or more conventional magnetic switches). The lift pins 114a-c may comprise stainless steel lift pins having ceramic balls or tips (not shown) disposed thereon which contact semiconductor wafers during cooling. Other lift pin materials may be used.

In one embodiment of the invention, each cooling platform 102a-c comprises a top portion 116a-c and a bottom portion 118a-c that encase a cooling fluid line 120a-c (FIGS. 4C and 4D). The top portions 116a-c and bottoms portions 118a-c may comprise, for example, nickel-plated aluminum or another suitable material, and may be coupled together (sandwiching the cooling fluid lines 120a-c therebetween) via any suitable coupling mechanisms (e.g., screws, bolts, adhesives, etc.). Thermal grease (e.g., MASTERBOND's SUPREME 10° AOHT) may be employed between the top portions 116a-c, the bottom portions 118a-c and the cooling fluid lines 120a-c to increase thermal transfer between these components. The cooling fluid lines 120a-c may comprise copper, stainless steel or any other appropriate material. In one embodiment, the top portion 116a-c of each cooling platform 102a-c is black anodized aluminum.

In an alternative embodiment for the cooling platforms 102a-c, each cooling fluid line 120a-c is placed between the top portion 116a-c and bottom portion 118a-c during casting of the top portion 116a-c and bottom portion 118a-c (e.g., each cooling platform 102a-c comprises an integrally formed unit). In such an embodiment, the cooling platforms 102a-c require no assembly and no thermal grease as the top and/or bottom portions (e.g., aluminum) completely surround the cooling fluid lines (e.g., stainless steel or copper). Cooling fluid lines having a higher melting temperature than the top/bottom portions are preferred so that the cooling fluid lines do not deform during cooling platform formation.

Regardless of the exact construction of the cooling platforms 102a-c, it may be desirable to have the top portion 116a-c of each cooling platform 102a-c thicker than the bottom portion 118a-c. That is, if the cooling fluid line of a cooling platform 102a-c is too close to the top surface of the cooling platform 102a-c, more cooling may occur in regions of the top surface that reside directly above the cooling fluid line. A larger (e.g., thicker) top portion 116a-c provides more thermal mass and may allow for more uniform cooling of each cooling platform 102a-c. In one embodiment of the invention, the total thickness of each cooling platform 102a-c is about 1.062 inches, although other thicknesses may be employed.

In at least one embodiment of the invention (FIG. 4B), the top portion 116a-c of each cooling platform 102a-c includes one or more of (1) insulating pads 122; (2) alignment pins 124; and (3) through holes 126 that allow the lift pins 114a-c to extend therethrough. The bottom portion 118a-c of each cooling platform 102a-c may be similarly configured with lift pin through holes (not shown).

The insulating pads 122 may comprise, for example, insulating balls partially embedded within the top portion 116a-c, such as ¼" silicon nitride, carbon or ceramic balls that extend about 0.040 inches above the top surface of each cooling platform 102a-c. The insulating pads 122 may be, for example, high temperature epoxy bonded to the top portion 116a-c of each cooling platform 102a-c. In one embodiment, a sufficient number and appropriately spaced arrangement of insulating pads 122 are employed on each cooling platform 102a-c to ensure that a semiconductor wafer placed on the insulating pads 122 does not contact the top surface of each cooling platform 102a-c. Preventing direct contact between a semiconductor wafer and the top surface of the cooling platforms 102a-c may (1) reduce particle generation; and (2) reduce non-uniform cooling of the semiconductor wafer (as non-uniformly cooling a wafer may damage the non-uniformly cooled portion of the wafer or shatter the wafer).

In one embodiment, a 0.040 inch air gap may exist between a semiconductor wafer placed on the insulating pads 122 and the top surface of the cooling platform 102a-c employing the insulating pads 122. Other air gap spacing may be used. When embedded balls are used as the pads 122, the depth of the ball holes within the top portion 116a-c of each cooling platform 102a-c may affect the distance between the top of the cooling platform 102a-c and the cooling fluid line 120a-c disposed therein, and/or the overall thickness of the cooling platform 102a-c.

The alignment pins 124 may comprise, for example, quartz or any other suitable material. In one embodiment, the alignment pins 124 comprise polished quartz (e.g., to minimize particle generation when a wafer contacts the pins 124) that is angled so as to allow a wafer to slide thereagainst without sticking. One exemplary angle is about 25 degrees from a center axis of each pin, although other angles may be employed. The alignment pins 124 allow accurate positioning of a semiconductor wafer on each cooling platform 102a-c. The use of alignment pins during wafer positioning is known in the art and is not described further herein.

With reference to FIGS. 4B and 4C, the cooling fluid line 120a of the cooling platform 102a (and the cooling fluid lines 120b-c of the cooling platforms 102b-c shown in FIG. 4D) comprises a hollow tube configured to deliver cooling fluid (e.g., water and/or a refrigerant) to the cooling platform 102a. In this manner, the top portion 116a and a semiconductor wafer placed thereon may be cooled. With reference to FIG. 4B, in one embodiment of the invention, the cooling fluid line 120a is specifically configured to reside within a single plane (e.g., the x-y plane in FIG. 4B). In this manner, the thickness of the cooling platform 102a is reduced (when compared to a design wherein the cooling fluid line does not reside entirely within a single plane). Such a "multi-plane" design may be employed if desired, and is shown, for example, in FIG. 4E.

The cooling fluid line 120a of FIGS. 4B and 4C has an inlet 128 and an outlet 130 both coupled to the manifold 104. In one embodiment, the inlet 128 is positioned close to the outer edge of the cooling platform 102a (as shown) and the outlet 128 is positioned close to the center of the cooling platform 102a (as shown). The inlet 128 is positioned close to the outer edge of the cooling platform 102a because (1) the largest percentage of the cooling platform's mass resides close to the outer edge of the cooling platform 102a; and (2) cooling fluid traveling through the cooling fluid line 120a is coolest at the inlet 128. In this manner, the "coolest" cooling fluid cools the largest portion of the cooling platform 102a.

Figure 4E:
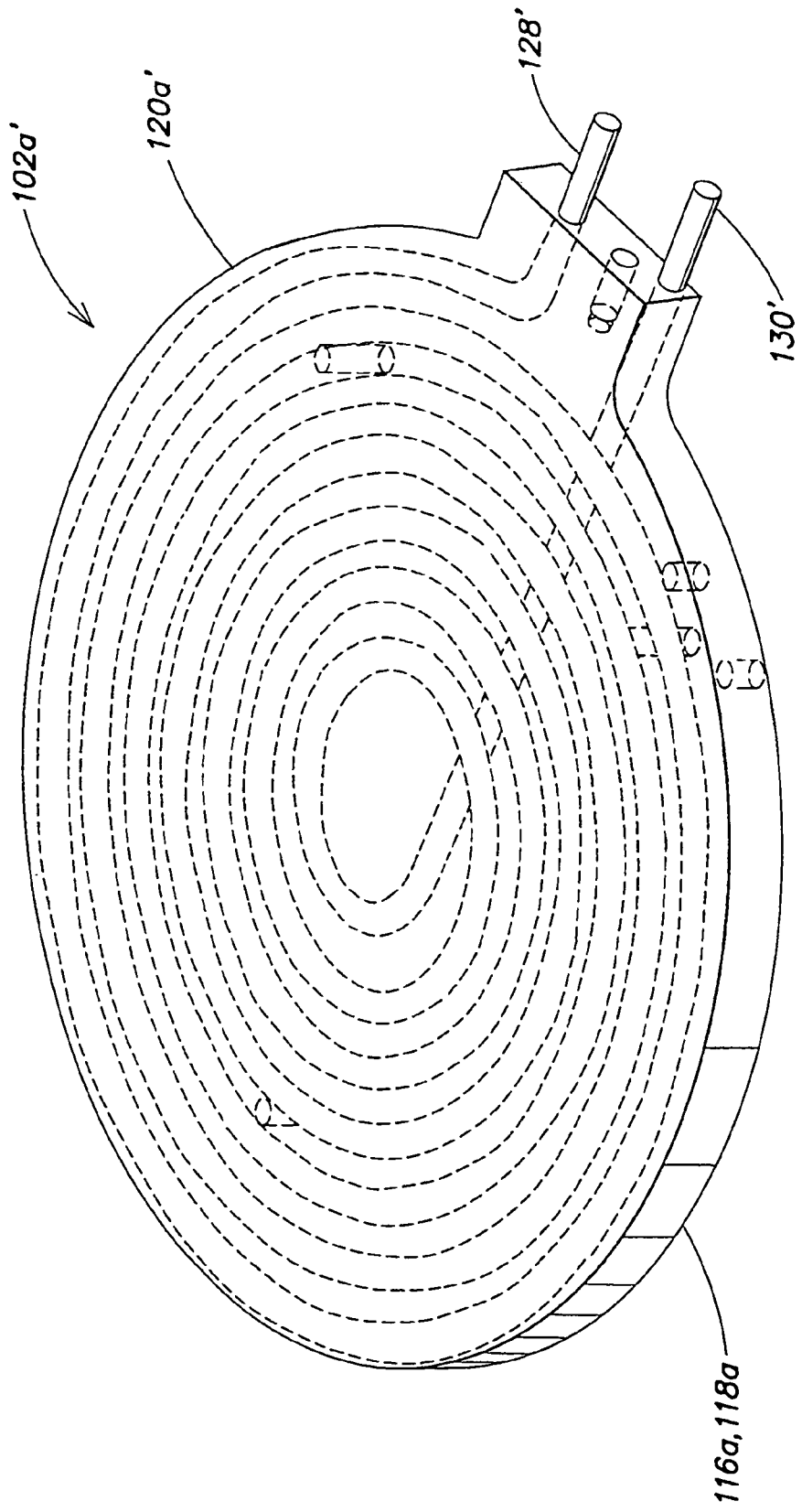

The remainder of the cooling fluid line 120a winds from the inlet 128 to the outlet 130 through the cooling platform 102a in a non-spiraling manner (unlike spiraling cooling fluid line 120a' of the cooling platform 102a' of FIG. 4E). That is, the cooling fluid line 120a creates a series of progressively smaller diameter, circular cooling fluid line paths 132a-f as the cooling fluid line 120a winds from the inlet 128 to the outlet 130. Each cooling fluid line path 132a-f provides cooling to the cooling platform 102a at an approximately equal radial distance along its path (unlike a cooling fluid line that spirals inward). Cooling uniformity thereby may be increased.

To achieve the progressively smaller diameter, circular fluid line paths 132a-f, the cooling fluid line 120a is provided with a series of bends 134a-e (FIG. 4C). In at least one embodiment of the invention, the bends 134a-e are positioned proximate the outlet 130 (as shown in FIG. 4C). Positioning the bends 134a-e proximate the outlet 130 may compensate for heating of cooling fluid as it travels from the inlet 128 to the outlet 130 by providing more cooling fluid line surface area proximate the outlet 130 (as described further below). The bends 134a-e may be, for example, elliptical. The amount of bending may be controlled to increase or decrease flow resistance through the cooling fluid line 120a.

In at least one embodiment, the cooling fluid line 120a is coupled to the manifold 104 by brazing the inlet 128 and the outlet 130 of the cooling fluid line 120a to an input line 132 and an outlet line 134 of the manifold 104, respectively (FIG. 4A). The cooling fluid lines 120b-c of the cooling platforms 102b-c may be similarly configured. In one embodiment, each cooling fluid line comprises ⅜ inch outer diameter and 0.475 inch inner diameter tubing. Other tubing sizes may be employed (such as larger tubing sizes that allow for larger flows).

To cool the cooling platforms 102a-c, water or some other cooling fluid is introduced under pressure to the input line 132 of the manifold 104. Exemplary input fluid pressures include 60-80 p.s.i., although other pressures may be employed. Assuming the flow resistances of the cooling fluid line 120a-c of each cooling platform 102a-c are approximately equal, the cooling fluid supplied to the input line 132 of the manifold 104 should flow approximately simultaneously to and approximately at the same flow rate through each cooling platform 102a-c. Each cooling platform 102a-c (and any semiconductor wafers placed thereon via the lift pins 114a-c) thereby may be cooled.

With regard to the cooling fluid line 120a (and the cooling fluid lines 120b-c of the cooling platforms 102b-c), cooling fluid travels from the input line 132 of the manifold 104 to the inlet 128 of the cooling fluid line 120a, through the cooling fluid line 120a and out the outlet 130 to the output line 134 of the manifold 104. In the embodiment of FIGS. 4B and 4C, the inlet 128 and the outlet 130 of the cooling fluid line 120a are positioned close to one another. The lateral dimensions of the manifold 104 thereby may be reduced.

As shown in FIGS. 4A-C, each cooling platform 102a-c is primarily circular, so as to mimic the shape of a semiconductor substrate and to increase cooling uniformity. A neck region 136a-c of each cooling platform 102a-c may have the same width as the manifold 104 (as shown in FIG. 4A and FIG. 4C). Note that while a smaller neck region 136a-c may result in more uniform cooling, a smaller neck region 136a-c also may make supporting each cooling platform 102a-c more difficult. Other cooling platform shapes may be employed.

As shown in FIG. 4B, each cooling platform 102a-c may be provided with holes (not shown) that receive rods 138a-b for holding/positioning the platform 102a-c relative to the manifold 104. A screw, bolt or other fastener (not shown) may be used to pull each cooling platform 102a-c against the manifold 104 (e.g., so that the cooling platforms 102a-c and the manifold 104 are perpendicular). Other fastening techniques may be similarly employed.

The cooling platforms 102a-c may be air cooled rather than liquid cooled. For example, the bottom portion 118a-c of each cooling platform 102a-c may be vented to increase air flow (e.g., using a heatsink pattern).

Figure 5:
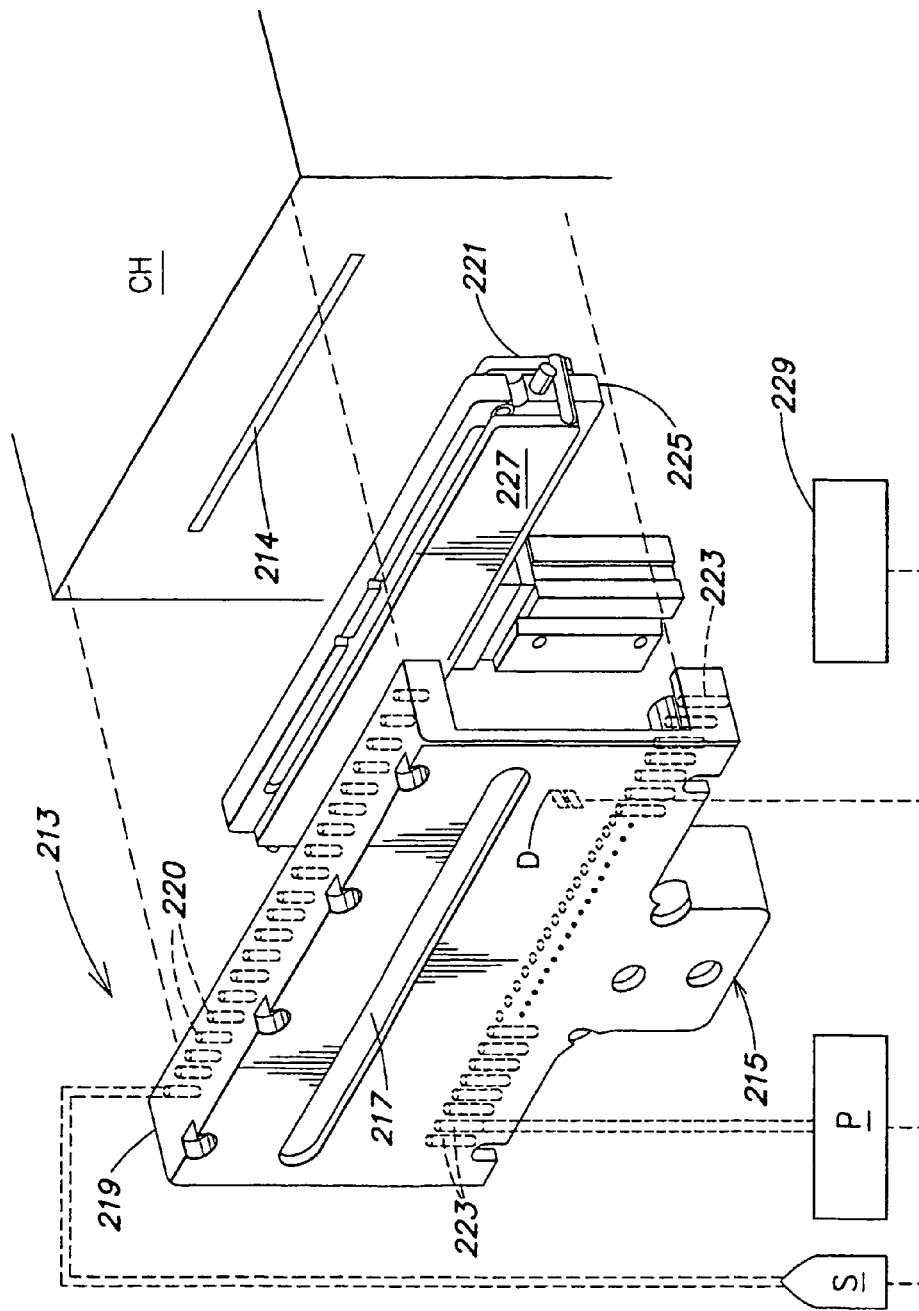
FIG. 5 is an exploded side isometric view of a valve assembly that may be employed within the system of FIG. 1.

With reference to the exploded side elevational view of FIG. 5, an inventive valve assembly 213 may be employed within the processing system 11, or within any tool that benefits from a mechanism for selectively sealing an opening 214 of a chamber CH and deterring particles and/or gas from traveling into and/or out of the chamber CH when the chamber opening 214 is not sealed.

The valve assembly 213 may comprise a housing 215 for coupling the assembly 213 adjacent the chamber opening 214 to be sealed. The housing 215 includes at least a first opening 217 through which a substrate may be transferred to the chamber opening 214, and a threshold portion 219 positionable adjacent the chamber opening 214. A plurality of inlets 220 may be formed in the threshold portion 219 and adapted to supply a curtain of gas across the chamber opening 214. The gas may be supplied, for example, from a gas source S (e.g., a source of an inert gas such as nitrogen, argon, or the like). For clarity, only one of the inlets 220 is shown being coupled to the gas source S. The inlets 220 may be positioned at other locations, such as along one or both sides of the housing 215.

As shown in FIG. 5, a sealing surface 221 may be coupled to the housing 215 and adapted to raise and lower with respect to the housing 215 so as to selectively (1) seal the chamber opening 214; and (2) retract from the chamber opening 214.

One or more openings 223 (which may be coupled to a vacuum pump P) are also provided in the housing 215 so that the flow of gas from the gas supply inlets 220 may be exhausted therethrough. For clarity, only one of the openings 223 is shown being coupled to the pump P. The openings 223 may be positioned at other locations, such as along one or both sides of the housing 215.

In one embodiment the gas supply S may be omitted and the interior region of the housing 215 may be vacuum pumped (e.g., via pump P) to ensure that the interior region of the housing 215 is at a lower pressure than the processing chamber CH before the processing chamber CH opens. Particles thereby may be prevented from flowing into the open processing chamber CH. Likewise, any gases which may remain in the processing chamber CH may be pumped out via the valve assembly's exhaust openings 223. In another embodiment, the vacuum pump P may be omitted while only the gas source S is employed.

The sealing surface 221 of the valve assembly 213 may be coupled to an inflatable member 225 that can be selectively inflated and deflated so as to selectively press the sealing surface 221 against the chamber opening 214 and retract the sealing surface 221 from pressing against the chamber opening 214. In one embodiment a pair of sealing surfaces (e.g., a first and a second sealing plate 221 and 227) may be positioned on opposite sides of the inflatable member 225 such that inflation of the inflatable member 225 presses both the first sealing plate 221 against the chamber opening 214, and the second sealing plate 227 against the opening 217 in the housing 215. Exemplary sealing surfaces 221, 227 and inflatable member 225 are described in U.S. Pat. No. 6,347,918, issued Feb. 19, 2002 titled "Inflatable Slit/Gate Valve" and U.S. Provisional Patent Application Ser. No. 60/216,918 filed Jul. 8, 2000, titled "Vacuum Assisted Door Assembly", both of which describe valve assemblies which may be modified to include the threshold portion 219 of the present invention, and both of which are incorporated herein in their entirety by this reference.

In operation, whenever the sealing surface 221 is retracted from contact with the chamber opening 214, inert gas (e.g., nitrogen from the gas source S) is supplied through the plurality of inlets 220 formed in the threshold portion 219. The gas flow may be initiated, for example, just before the chamber opening 214 is unsealed. In one embodiment, a controller 229, which may or may not be used to control processing within the chamber CH, is coupled to pressure detectors D (only one of which is shown in FIG. 5) which receive pressure readings from the processing chamber CH and/or from the interior region of the valve assembly 213. The controller 229 also may be coupled to the pump P and the gas source S for controlling pumping from and/or gas delivery to the interior region of the valve assembly 213. The controller 229 may adjust the pressure of the interior region of the valve assembly 213 (e.g., by vacuum pumping the region at a greater rate than the inert gas flow thereto (if any), so that contaminants will be deterred from entering the processing chamber CH, and/or so that potentially harmful chamber gases will be removed as soon as they escape from the processing chamber CH).

The diameter and spacing between the inlets 220 is chosen together with the flow rate of the gas so that a continuous laminar curtain of gas flows across the chamber opening 214. In this manner the gas flow from the inlets 220 may immediately carry any chemicals which may escape from the chamber opening 214 to the exhaust (e.g., via openings 223). For example, if the inventive valve assembly 213 is employed within the processing system 11 (FIG. 1), any harmful chemicals employed within the processing chambers 19a-b may be prevented from entering the transfer chamber 13. The inventive slit valve assembly 213 is particularly advantageous when employed to seal between a chamber that is maintained at atmospheric pressure (and thus not pumped and purged like a vacuum chamber) and a processing chamber that employs toxic gases (e.g., a chamber that performs a nitridization process that employs ammonium) whether or not the processing chamber operates at vacuum or atmospheric pressures. For example, the use of the valve assembly 213 may be desirable when the processing chamber CH performs dry oxidation processes.

The number of inlets 220 and the number of outlets 223 need not be the same, and the inlets and/or outlets may comprise any suitable shape (e.g., round, square, etc.). The controller 229 may include one or more computer program products for (1) detecting the pressure level within the interior region of the valve assembly 213 (e.g., via detectors D); (2) controlling/regulating flow of gas to the valve assembly 213 (e.g., via a pressure regulator, flow controller, etc. (not shown) of the gas source S); and/or (3) controlling/regulating pumping of gas from the valve assembly 213 (e.g., via a throttle valve (not shown) of the pump P, by varying the speed of the pump P, etc.). Each computer program product described herein may be carried by a medium readable by a computer (e.g., a carrier wave signal, a floppy disc, a compact disc, a DVD, a hard drive, a random access memory, etc.).

It will be understood that the housing 215 may include a back wall portion having an opening (both not shown) for positioning adjacent the chamber opening 214, or, as is shown in FIG. 5, the chamber wall may act as a back wall of the housing 215.

The foregoing description discloses only exemplary embodiments of the invention; modifications of the above disclosed apparatus and method which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A substrate processing system comprising:
   a chamber having a plurality of openings through which a substrate is transported;
   a substrate carrier opener coupled to a first one of the plurality of openings;
   a thermal processing chamber coupled to a second one of the plurality of openings; and
   a wafer handler within the chamber, comprising a first arm having a substrate clamping blade including a clamping mechanism configured to transport only non-high temperature substrates and a second arm having a non-clamping blade having no clamping mechanism and configured to transport only high temperature substrates, wherein the clamping blade and non-clamping blade are adapted to be used concurrently,
   wherein the first arm having the substrate clamping blade transports wafers at a first speed and the second arm having the non-clamping blade transports wafers at a second speed, and the first speed is greater than the second speed.

2. The system of claim 1 wherein the substrate clamping blade and the non-clamping blade are vertically stacked.

3. The system of claim 2 wherein the wafer handler is adapted to elevate so as to position a desired one of the clamping blade and the non-clamping blade at a desired elevation.

4. The system of claim 1 wherein the non-clamping blade comprises a sensor for detecting the presence of a substrate properly positioned thereon.

5. The system of claim 1 wherein the substrate clamping blade comprises a sensor for detecting the presence of a substrate properly positioned thereon.

6. The system of claim 5 wherein the non-clamping blade comprises a sensor for detecting the presence of a substrate properly positioned thereon.

7. The system of claim 1 further comprising a track contained within the chamber and having the wafer handler mounted thereon so as to travel therealong.

8. A substrate processing system comprising:
   a chamber having a plurality of openings through which a substrate may be transported; and
   a wafer handler contained within the chamber comprising a first arm having a substrate clamping blade including a clamping mechanism and configured to transport only non-high temperature substrates and a second arm having a non-clamping blade having no clamping mechanism and configured to transport only high temperature substrates, wherein the clamping blade and non-clamping blade are adapted to be used concurrently
   wherein the first arm having the substrate clamping blade transports wafers at a first speed and the second arm having the non-clamping blade transports wafers at a second speed, and the first speed is greater than the second speed.

9. The system of claim 8 wherein the substrate clamping blade and the non-clamping blade are vertically stacked.

10. The system of claim 9 wherein the wafer handler is adapted to elevate so as to position a desired one of the substrate clamping blade and the non-clamping blade at a desired elevation.

11. The system of claim 8 wherein the blade adapted to transport high temperature substrates comprises a sensor for detecting the presence of a substrate properly positioned thereon, and wherein the substrate clamping blade comprises a sensor for detecting the presence of a substrate properly positioned thereon.

12. The system of claim 8 wherein the non-clamping blade comprises a sensor for detecting the presence of a substrate properly positioned thereon.

13. The system of claim 8 wherein the substrate clamping blade comprises a detector for detecting the presence of a substrate properly positioned thereon.

14. The system of claim 8 further comprising a track contained within the chamber and having the wafer handler mounted thereon so as to travel therealong.

15. A substrate handler comprising:
   a first arm comprising a substrate clamping blade including a clamping mechanism and configured to transport only non-high temperature substrates; and
   a second arm comprising a non-clamping blade having no clamping mechanism and configured to transport only high temperature substrates,
   wherein the clamping blade and non-clamping blade are adapted to be used concurrently,
   further wherein the first arm having the substrate clamping blade transports wafers at a first speed and the second arm having the non-clamping blade transports wafers at a second speed, and the first speed is greater than the second speed.

16. The substrate handler of claim 15 wherein the substrate clamping blade and the non-clamping blade are vertically stacked.

17. The substrate handler of claim 16 wherein the wafer handler is adapted to elevate so as to position a desired one of the substrate clamping blade and the non-clamping blade at a desired elevation.

18. The substrate handler of claim 15 wherein the non-clamping blade comprises a sensor for detecting the presence of a substrate properly positioned thereon, and wherein the substrate clamping blade comprises a sensor for detecting the presence of a substrate properly positioned thereon.

19. The substrate handler of claim 15 wherein the non-clamping blade comprises a sensor for detecting the presence of a substrate properly positioned thereon.

20. The substrate handler of claim 15 wherein the substrate clamping blade comprises a detector for detecting the presence of a substrate properly positioned thereon.

21. The substrate handler of claim 19 wherein the sensor comprises an emitter and a detector, and wherein a non-refractive material is positioned adjacent the emitter and the detector so as to prevent an emitted signal from coupling through the non-clamping blade to the detector.

22. A method of transporting a substrate, comprising:
providing a substrate handler having a clamping blade and a non-clamping blade, wherein the clamping blade and non-clamping blade are adapted to be used concurrently;
picking up a first substrate with the clamping blade of the substrate handler, the clamping blade including a clamping mechanism;
clamping the first substrate via the clamping blade;
transporting the first substrate to a thermal processing chamber via the clamping blade, wherein transporting the first substrate occurs at a first speed;
processing the first substrate within the thermal processing chamber to thereby heat the first substrate;
extracting the heated first substrate from the thermal processing chamber via the non-clamping blade of the substrate handler that is configured to transport a high temperature substrate, the non-clamping blade having no clamping mechanism; and
transporting the heated first substrate via the non-clamping blade, wherein transporting the heated first substrate occurs at second speed, and the first speed is greater than the second speed;
wherein the clamping blade is in contact with the first substrate only when the first substrate has a non-high temperature.

23. The method of claim 22 further comprising placing a second substrate in the thermal processing chamber via the clamping blade after the heated first substrate is extracted from the thermal processing chamber, and while the heated first substrate is held by the non-clamping blade, such that the substrate exchange occurs without intermission.

24. The method of claim 23 further comprising sensing, via a clamping blade sensor, whether the clamping blade has properly clamped a substrate prior to transporting the substrate to another processing location.

25. The method of claim 23 further comprising sensing, via a high temperature blade sensor, whether a substrate is properly positioned on the non-clamping blade prior to transporting the substrate via the non-clamping blade.

26. The method of claim 24 wherein the clamping blade comprises a detector for detecting the presence of a substrate properly positioned thereon.

27. The method of claim 24 further comprising signaling an error if proper placement of a substrate is not sensed on the clamping blade and preventing transport of the improperly placed substrate.

28. The method of claim 25 further comprising signaling an error if proper placement of a substrate is not sensed on the blade and preventing transport of the improperly placed substrate.

* * * * *